United States Patent [19]

Tsuji et al.

[11] Patent Number: 5,440,170
[45] Date of Patent: Aug. 8, 1995

[54] SEMICONDUCTOR DEVICE HAVING A DIE PAD WITH ROUNDED EDGES AND ITS MANUFACTURING METHOD

[75] Inventors: Kazuto Tsuji; Yoshiyuki Yoneda; Junichi Kasai, all of Kawasaki, Japan

[73] Assignee: Fujitsu Limited, Kawasaki, Japan

[21] Appl. No.: 849,378

[22] PCT Filed: Sep. 9, 1991

[86] PCT No.: PCT/JP91/01195

§ 371 Date: Jun. 29, 1992

§ 102(e) Date: Jun. 29, 1992

[87] PCT Pub. No.: WO92/04730

PCT Pub. Date: Mar. 19, 1992

[30] Foreign Application Priority Data

Sep. 10, 1990 [JP] Japan .................. 2-239622

[51] Int. Cl.⁶ .................. H01L 23/48; H01L 29/44; H01L 29/52; H01L 29/60
[52] U.S. Cl. .................. 257/676; 257/666
[58] Field of Search .................. 257/676, 666, 670, 671

[56] References Cited

U.S. PATENT DOCUMENTS

| | | | |
|---|---|---|---|
| 4,714,952 | 12/1987 | Takekawa et al. | 257/676 |
| 4,884,124 | 11/1989 | Mori et al. | 257/676 |
| 4,918,511 | 4/1990 | Brown | 257/676 |
| 4,942,452 | 7/1990 | Kitano | 257/676 |
| 4,984,059 | 1/1991 | Kubota et al. | 257/676 |
| 5,083,186 | 1/1992 | Okada et al. | 257/669 |
| 5,119,171 | 6/1992 | Lesk et al. | 257/787 |
| 5,196,725 | 3/1993 | Mita et al. | 257/666 |

FOREIGN PATENT DOCUMENTS

| | | | |
|---|---|---|---|
| 0076542 | 6/1981 | Japan | 437/220 |
| 59-79536 | 5/1984 | Japan . | |
| 59-96757 | 6/1984 | Japan . | |
| 59-117141 | 7/1984 | Japan . | |
| 0175753 | 10/1984 | Japan . | |
| 60-77432 | 5/1985 | Japan . | |
| 63-54759 | 3/1988 | Japan . | |
| 63-308359 | 12/1988 | Japan . | |
| 64-14942 | 1/1989 | Japan . | |
| 64-81257 | 3/1989 | Japan . | |
| 0243531 | 9/1989 | Japan | 437/217 |
| 1-251747 | 10/1989 | Japan . | |
| 2-90663 | 3/1990 | Japan . | |
| 2-129953 | 5/1990 | Japan . | |
| 2-138765 | 5/1990 | Japan . | |
| 0202046 | 8/1990 | Japan | 437/217 |
| 3-83366 | 4/1991 | Japan . | |

Primary Examiner—Andrew J. James
Assistant Examiner—S. V. Clark
Attorney, Agent, or Firm—Armstrong, Westerman, Hattori, McLeland & Naughton

[57] ABSTRACT

A semiconductor device employs a lead frame including a die pad (24) and a plurality of leads (25) provided outside the die pad, and is manufactured by sealing the die pad and its periphery by a resin after the die pad is fitted with the semiconductor chip (11). The die pad (24) is formed separately from the main part of the lead frame provided with leads, and is rounded at an entire outermost edge thereof and includes a flat plate shape. This die pad can be either formed rounded with ceramic or resin, or formed in metal and given a rounded edge through honing.

6 Claims, 4 Drawing Sheets

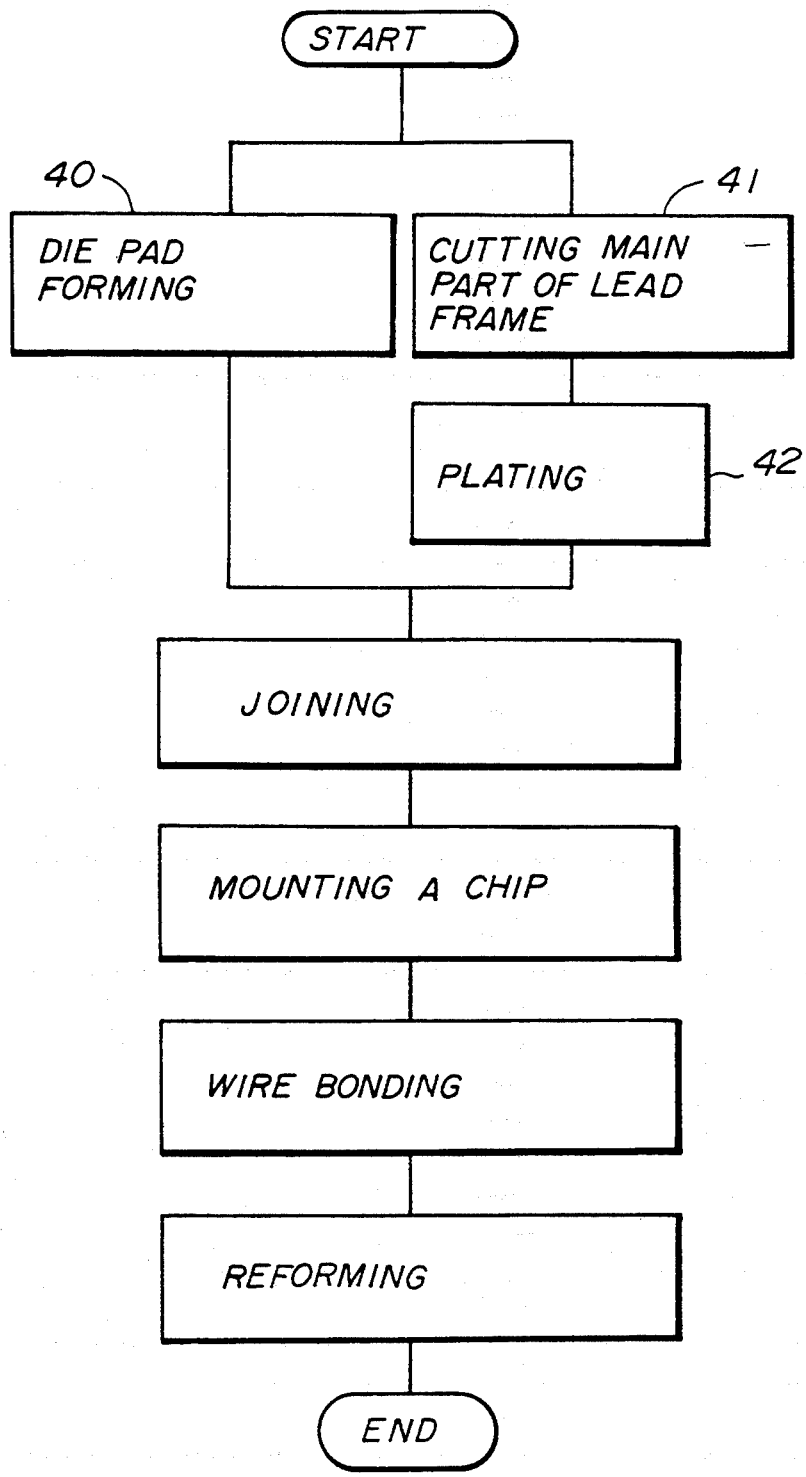

SEMICONDUCTOR DEVICE HAVING A DIE PAD WITH ROUNDED EDGES AND ITS MANUFACTURING METHOD

FIELD OF THE INVENTION

The present invention relates to a semiconductor device and its manufacturing method, and particularly to a semiconductor device which employs a lead frame and is hermetically sealed by resin, and a method of manufacturing such a semiconductor device.

DESCRIPTION OF THE RELATED ART

FIG. 1 is a side cross-sectional view showing an example of conventional semiconductor devices which employ lead frames and sealed by resin.

In FIG. 1, 11 represents a semiconductor chip, 12 a resin package, 13 wires, 14 a die pad, 15 leads, 16 a support bar.

The semiconductor chip 11 is fixed on the die pad 14, which has a flat plate shape, and is connected to the leads 15 through the wires 13 by wire-bonding. The leads 15 make external connection with circuits formed onto the semiconductor chip 15.

The resin package 12 seals the semiconductor chip 11 and its periphery, and protects the semiconductor chip 11 and its periphery from the environment. The periphery includes the die pad 14, the wires 13 and those parts of the leads 15 attached to the semiconductor 11.

A semiconductor device, as described above, is generally called a resin-sealed semiconductor device. Such a semiconductor device is manufactured by using the die pad 14 and a lead frame having the leads 15 disposed outside the die pad 14. The semiconductor chip 11 is mounted onto the die pad 14 (and the wires 13 are connected). Then, the resin package 12 is formed by means of resin molding.

The lead frame used in the manufacture practiced in the prior art is formed by cutting it from a metal plate by press working or etching in a pattern such that the leads 15 and the support bar 16 are connected, after providing the support bar 16 in an arrangement such that it is placed, as a support for the die pad 14, in alignment with the leads 15 and extends from the die pad 14. Excess parts from that operation are cut off after the resin package 12 is formed.

Recently, shifts toward downsizing of semiconductor devices, and toward using surface packaging, has brought about a serious problem in which either spontaneous moisture absorption of the resin package 2, or thermal stress at the time of the printed board packaging cause the destructive crack on the resin package 12 to start at an edge of the die pad 14 as shown in FIG. 2A. This results from the fact that the outermost edge of the die pad 14 is sharp.

This has been conventionally dealt with by chamfering the edge of the die pad 14, on the lead frame, by press working. This, however, can easily create a burr 18 during chamfering, making it impossible to fully prevent a crack 7 from resulting due to this burr 18.

The present inventor attempted, as a simple means of performing chamfering of the die pad, an etching in which the entire lead frame is soaked in a chemical. The following problems arose, however, resulting in the lead frame not performing the function expected of it. Etching developed extensively on the leads and other narrow parts before the desired chamfer of the die pad was obtained, rendering etched parts out of shape, and resulting in an irregular thickness of the lead frame, and in inaccuracy, when feeding the lead frame, at the time a semiconductor chip was mounted on it. An extremely high number of resin burrs was created in the resin molding process for forming the resin package. Following the resin package forming, the dimension of bending became unstable in the lead bending.

Japanese Laid-Open Patent Application No. 1-251747 describes a process in which resist is applied to the die pad of the lead frame and the edge of the die pad is chamfered by means of etching.

However, applying resist to the formed lead frame makes it difficult to ensure high precision due to a deformation of the lead frame. Thus the process has been accompanied by the difficulty and inpracticability of chamfering the edge even if it is etched.

SUMMARY OF THE INVENTION

Accordingly, a general object of the present invention is to provide a novel and useful semiconductor device, and a method of manufacturing it, in which the disadvantages of the aforementioned prior art are eliminated.

A more specific object of the present invention is to provide a semiconductor in which the occurrence of cracks in the resin package, starting at the edge of the die pad, is forestalled.

Another object of the present invention is to provide a semiconductor device employing a lead frame including a die pad and a pluarality of leads provided outside the die pad, and manufactured by sealing the die pad and its periphery by resin after the die pad is fitted with a semiconductor chip, wherein:

the die pad being formed separately from a main part of the lead frame having leads, and rounded on an entire outermost edge of the die pad, and has a flat plate shape.

Another object of the present invention is to form a ceramic die pad rounded.

Another object of the present invention is to form a resin die pad rounded.

Another object of the present invention is to form the die pad with metal and round it by honing.

Another object of the present invention is to create a radius of curvature greater than 0.03 mm when rounding the edge of the die pad.

Another object of the present invention is to provide a method of manufacturing a semiconductor comprising the steps of forming a die pad with its outermost edge rounded, forming a main part of a lead frame including interconnected leads, and support bar for supporting the die pad, joining the support bar with the die pad, mounting a semiconductor chip on the die pad with which the support bar is joined, wire-bonding the semiconductor chip with the pluarality of leads; and sealing, by resin, the semiconductor chip onto the die pad and the wire-bonded leads.

BRIEF DESCRIPTION OF THE DRAWINGS

FIG. 5 is a diagram illustrating a manufacturing process of the semiconductor device of the present invention.

DETAILED DESCRIPTION OF THE PREFERRED EMBODIMENT

Figure 3:
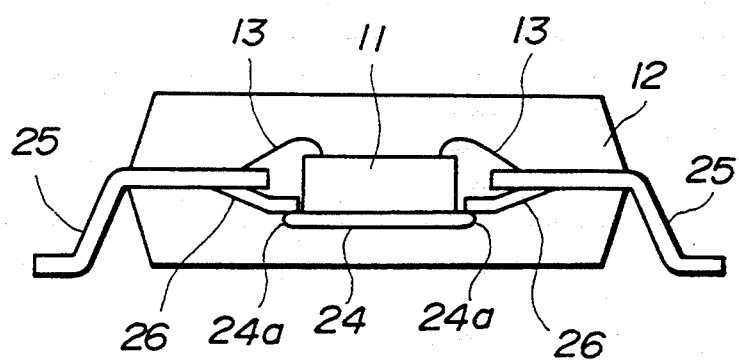
FIG. 3 is a side cross-sectional view of an example embodiment of the semiconductor device of the present invention.
Figure 4A:
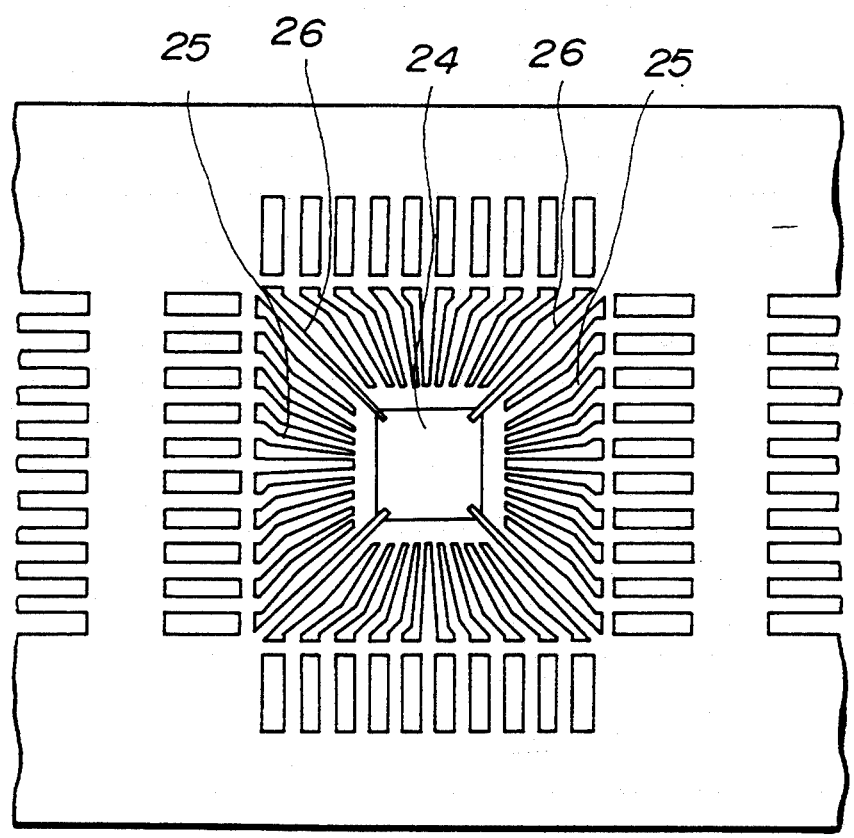
FIG. 4A is a plan view of the lead frame.
Figure 4B:
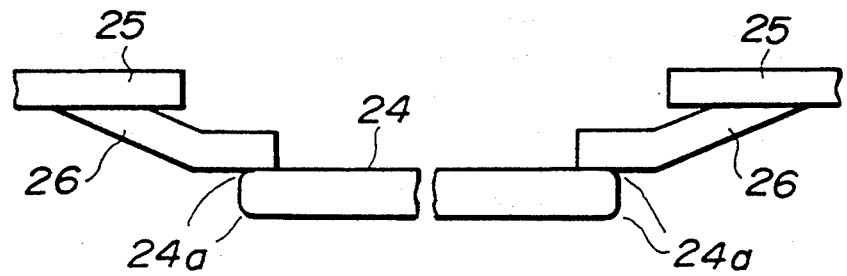
FIG. 4B is a partially enlarged side cross-sectional view of the lead frame.

FIG. 3 is a side cross-sectional view of an embodiment of the present invention. FIGS. 4A and 4B are, respectively, a plan view of a lead frame, and a partially enlarged side cross-sectional view of the lead frame. Parts that are the same from figure to figure have the same reference numerals.

Figure 1:
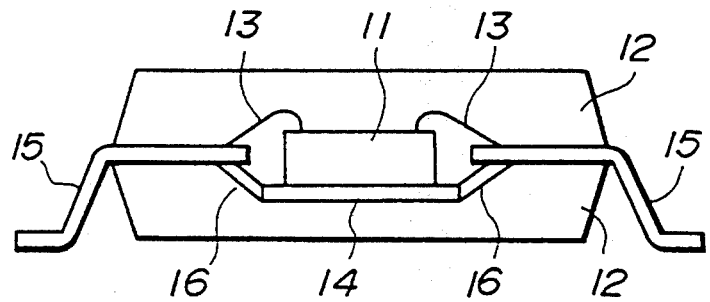
FIG. 1 is a side cross-sectional view of an example semiconductor device in the prior art.

Referring to FIG. 3, the embodiment of the semiconductor device illustrated in the figure is manufactured by employing a die pad and a lead frame mentioned in the following as in the case of the prior art illustrated in FIG. 1. The semiconductor chip 11, the resin package 12, and the wires 13 are the same as those in the prior art while the die pad 14 of the prior art is replaced with a die pad 24, and is separated from leads 25. In the figure, 26 represents a support bar.

The die pad 24 comprises sintered ceramic formed by molding AlN (aluminum nitride), for example, into a flat plate shape, as done in the prior art, and producing a rounded edge 24a on the entire outermost edge. AlN, a material of the die pad 24, has, as compared with the resin package 12, a small coefficient of linear expansion, a small thermal stress, good contact with the resin package 24, and a great coefficient of thermal conductivity, attributes that make it most suitable as a material for the die pad 24.

The die pad 24 can be formed not only with a ceramic, such as AlN, but also with such metals as Fe containing 42% nickel or Ni alloy (42 alloy), or a resin. When using metal, the metal should be fully honed, with alumina powder (barrel polishing) for example, in order to produce the rounded edge 24a. When using resin the chamfer 24a is produced at the time of forming, as in the case of ceramic. Ceramic and resin have an advantage in that they do not require any additional process to form the rounded edge 24a.

In this invention, the rounded edge 24a is very easily formed because the die pad 24 is produced as an independent part.

Figure 2A:
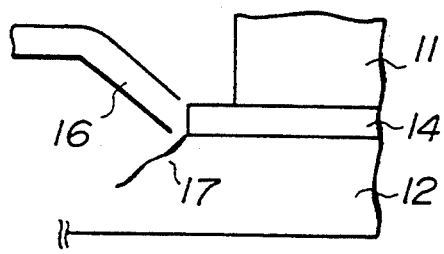
FIG. 2A illustrates a problem with the prior art.
Figure 2B:
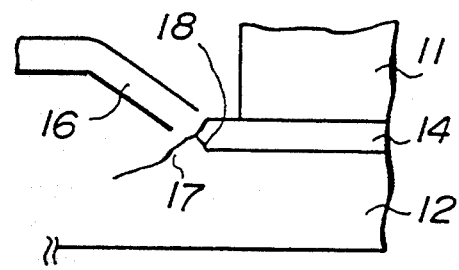
FIG. 2B illustrates a problem with the prior art.

The radius of curvature of the rounded edge 24a should be about 0.03 mm. This rounded edge 24a eliminates the sharpness of the outermost edge of the die pad 24, thus preventing the crack 7, illustrated in FIG. 2A, from occurring in the resin package 2.

The following data obtained in experiments, including 100 samples for each radius of curvature of the rounded edge concern the relationship between the radius of curvature of the rounded edge 24a and the occurrence of the crack in the semiconductor device.

| Radius of curvature of the rounded edge | Occurrence of the crack |
| --- | --- |
| 0.02 mm | 18% |
| 0.03 mm | 0% |
| 0.04 mm | 0% |
| 0.05 mm | 0% |

It is evident from this that by ensuring that the radius of curvature of the rounded edge 24a is greater than or equal to 0.03 mm it is possible to sufficiently prevent the occurrence of the crack 17. In principle, it is preferable that this radius of curvature be large.

A description is given below of an example of an embodiment of the lead frame used in manufacturing the aforementioned example semiconductor device.

This lead frame has the leads 25 arranged at the outside of the die pad 24, and with the support 26 set along the leads 25, for support of the die pad 24. This assembly of the leads 25 and the support bar 26 is cut from a metal plate by means of press working or etching in a pattern that makes them interconnected. The main part of the lead frame, which is produced separately from the independently produced die pad 24, is integrated with the die pad 24 through conjunction with the support bar 26. Accordingly, the choice of material for the die pad 24 is not limited to metal used in the main part of the lead frame, but can include any metal, ceramic or resin. Unneeded excess parts are cut after the package 12 is formed, as in the case of the example prior art manufacture shown in FIG. 1.

The most characteristic point of this lead frame is that the entire outermost edge of the die pad 24 is provided with the rounded edge 24a, as shown in the partially enlarged side cross-sectional view of FIG. 4B. An explanation has already been given of the radius of curvature of the rounded edge 24a, and its utility.

Joining of the die pad 24 and the support bar 26 can be performed by laser welding in the case of ceramic and resin, electric welding in the case of metal, an adhesive in the case of resin, for example.

The thickness of the die pad 24 may be chosen on the basis of the above knowledge, and a thickness similar to that of the main part of the lead frame, for example, is preferable.

In FIG. 4A and FIG. 4B, the support bar 26 is joined to the top of die pad 24; it can, alternatively, be joined to its bottom.

FIG. 5 is a diagram illustrating the process of the semiconductor device manufacture practiced in the present invention.

Referring to FIG. 5, at step 40 the die pad 24 is formed with the rounded edge 24a formed on it. As mentioned previously, ceramic and resin require only one process in order to form the die pad 24, whereas metal requires an additional process of polishing.

Cutting of the main part of the lead frame is performed at step 41 at the same time as the above mentioned step 40 takes place. Plating of the main part of the lead frame is done at step 42.

The lead frame is completed at step 43, by joining the die pad 24 with the support bar 26 in the main part of the lead frame. The semiconductor chip 11 is mounted onto the die pad 24 at step 44, and at step 45 the wires 13 are wire-bonded between the semiconductor chip 11 and the leads 15. At step 46 the resin package 12 is molded, and at step 47 the package is formed by cutting excess parts off the lead frame, thus completing the semiconductor device.

Thus, the occurrence of the crack 17 is caused by the sharpness of the outermost edge of the die pad (shown as 4 in the prior art example). When the entire outermost edge of the die pad is rounded, occurrence of the aforementioned crack is prevented because there is no area having a sharp edge. Ensuring that the radius of curvature of the chamfer is greater than or equal to 0.03 mm satisfactorily prevents the occurrence of the crack, as mentioned in the following.

Also, the aforementioned lead frame can be easily chamfered because the die pad is an independent part; this also leads to a variety in the choice of materials for the die pad.

The present invention prevents cracks in the resin package from starting at the edge of the die pad because the outermost edge of the die pad is chamfered. This invention makes rounding of the outermost edge of the die pad possible, by producing the die pad separately from the main part of the lead frame.

We claim:

1. A semiconductor device manufactured employing a lead frame including a die pad and a plurality of leads provided outside said die pad, and manufactured by sealing of said die pad and its periphery by resin after said die pad is fitted with a semiconductor chip, said die pad being formed separately from a main part of the lead frame having leads and having a flat plate shape, wherein said die pad has a rounded outermost edge having a radius of curvature greater than or equal to 0.03 mm.

2. A semiconductor device as claimed in claim 1, wherein said die pad is made of a ceramic and said outermost edge is rounded during forming of said die pad.

3. A semiconductor device as claimed in claim 1, wherein said die pad is made of a resin and said outermost edge is rounded during forming of said die pad.

4. A semiconductor device as claimed in claim 1, wherein said die pad is made of a metal and said outermost edge is rounded by honing.

5. A method of manufacturing a semiconductor comprising the steps of:
   forming a die pad with a rounded outermost edge having a radius of curvature greater than or equal to 0.03 mm,
   forming a main part of a lead frame including interconnected leads and a support bar for supporting said die pad,
   joining said support bar with said die pad,
   mounting a semiconductor chip on the die pad with which said support bar is joined,
   wire-bonding said semiconductor chip with the plurality of leads, and
   sealing, by resin, the semiconductor chip onto the said die pad and the wire-bonded leads.

6. A semiconductor device as claimed in claim 2, wherein the area of said die pad is less than an area defined by tip ends of the plurality of leads.

* * * * *